US011062782B2

(12) United States Patent
Wang et al.

(10) Patent No.: US 11,062,782 B2
(45) Date of Patent: Jul. 13, 2021

(54) THREE-DIMENSIONAL MEMORY DEVICE PROGRAMMING WITH REDUCED DISTURBANCE

(71) Applicant: YANGTZE MEMORY TECHNOLOGIES CO., LTD., Wuhan (CN)

(72) Inventors: Ming Wang, Wuhan (CN); Hong Tao Liu, Wuhan (CN); Yali Song, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 0 days.

(21) Appl. No.: 17/100,866

(22) Filed: Nov. 21, 2020

(65) Prior Publication Data

US 2021/0090671 A1    Mar. 25, 2021

Related U.S. Application Data

(60) Division of application No. 16/542,270, filed on Aug. 15, 2019, now Pat. No. 10,892,023, which is a
(Continued)

(30) Foreign Application Priority Data

Mar. 29, 2019    (CN) .......................... 201910252053.5

(51) Int. Cl.
*G11C 16/04* (2006.01)
*G11C 16/34* (2006.01)
(Continued)

(52) U.S. Cl.
CPC .......... *G11C 16/3418* (2013.01); *G11C 16/08* (2013.01); *G11C 16/12* (2013.01); *G11C 16/28* (2013.01); *H01L 27/249* (2013.01)

(58) Field of Classification Search
CPC ..... G11C 16/3418; G11C 16/08; G11C 16/12; G11C 16/28; H01L 27/249
(Continued)

(56) References Cited

U.S. PATENT DOCUMENTS

| 2013/0170303 A1* | 7/2013 | Ahn | ...................... | H01L 29/792 |
| | | | | 365/185.25 |
| 2013/0301366 A1* | 11/2013 | Huh | ........................ | G11C 8/14 |
| | | | | 365/189.011 |

(Continued)

FOREIGN PATENT DOCUMENTS

| CN | 101847438 A | 9/2010 |
| CN | 106169306 A | 11/2016 |

(Continued)

OTHER PUBLICATIONS

International Search Report issued in corresponding International Application No. PCT/CN2019/088966, dated Jan. 6, 2020, 4 pages.
(Continued)

*Primary Examiner* — Harry W Byrne
(74) *Attorney, Agent, or Firm* — Bayes PLLC

(57) ABSTRACT

Embodiments of 3D memory devices and methods for operating the 3D memory devices are disclosed. In an example, a method for operating a 3D memory device is disclosed. The 3D memory device includes a plurality of memory decks each including a plurality of memory layers in a vertical direction, and a plurality of first dummy memory layers between the first and second memory decks in the vertical direction. Each memory layer in a first memory deck of the plurality of memory decks is first programmed. The first programming includes applying a program voltage to the memory layer and a channel pass voltage smaller than the program voltage to each of the rest of the memory layers in the first memory deck. Each memory layer in a second memory deck of the plurality of (Continued)

memory decks above the first memory deck is second programmed. The second programming includes applying the program voltage to the memory layer and the channel pass voltage to each of the rest of the memory layers in the second memory deck. The second programming also includes applying a 0 V-voltage to at least one of the first dummy memory layers. The second programming further includes applying the 0 V-voltage to each memory layer in the first memory deck.

20 Claims, 9 Drawing Sheets

Related U.S. Application Data continuation of application No. PCT/CN2019/088966, filed on May 29, 2019.

(51) Int. Cl.
*G11C 16/08* (2006.01)
*G11C 16/12* (2006.01)
*G11C 16/28* (2006.01)
*H01L 27/24* (2006.01)

(58) Field of Classification Search
USPC ................................................. 365/185.02
See application file for complete search history.

(56) References Cited

U.S. PATENT DOCUMENTS

| | | | |
|---|---|---|---|
| 2014/0269080 | A1 | 9/2014 | Lee |
| 2014/0293693 | A1 | 10/2014 | Nam et al. |
| 2016/0293266 | A1* | 10/2016 | Chen ................ G11C 7/04 |
| 2017/0125109 | A1* | 5/2017 | Park ................ G11C 16/32 |
| 2017/0140829 | A1* | 5/2017 | Park ................ G11C 16/3459 |

FOREIGN PATENT DOCUMENTS

| | | |
|---|---|---|
| CN | 107665719 A | 2/2018 |
| CN | 107665721 A | 2/2018 |
| CN | 108028066 A | 5/2018 |
| CN | 108281166 A | 7/2018 |
| CN | 109493905 A | 3/2019 |
| CN | 109961820 A | 7/2019 |

OTHER PUBLICATIONS

Written Opinion of the International Searching Authority issued in corresponding International Application No. PCT/CN2019/088966, dated Jan. 6, 2020, 4 pages.

* cited by examiner

THREE-DIMENSIONAL MEMORY DEVICE PROGRAMMING WITH REDUCED DISTURBANCE

CROSS-REFERENCE TO RELATED APPLICATIONS

This application is division of U.S. application Ser. No. 16/542,270, filed on Aug. 15, 2019, entitled "THREE-DIMENSIONAL MEMORY DEVICE PROGRAMMING WITH REDUCED DISTURBANCE," which is a continuation of International Application No. PCT/CN2019/088966, filed on May 29, 2019, entitled "THREE-DIMENSIONAL MEMORY DEVICE PROGRAMMING WITH REDUCED DISTURBANCE," which claims the benefit of priority to Chinese Patent Application No. 201910252053.5 filed on Mar. 29, 2019, all of which are incorporated herein by reference in their entireties.

BACKGROUND

Embodiments of the present disclosure relate to three-dimensional (3D) memory devices and operation methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and methods for operating the 3D memory devices are disclosed herein.

In one example, a method for operating a 3D memory device is disclosed. The 3D memory device includes a plurality of memory decks each including a plurality of memory layers in a vertical direction. Each memory layer in a first memory deck of the plurality of memory decks is first programmed. The first programming includes applying a program voltage to the memory layer and a first channel pass voltage smaller than the program voltage to each of the rest of the memory layers in the first memory deck. Each memory layer in a second memory deck of the plurality of memory decks above the first memory deck is second programmed. The second programming includes applying the program voltage to the memory layer and the first channel pass voltage to each of the rest of the memory layers in the second memory deck. The second programming further includes applying a second channel pass voltage smaller than the first channel pass voltage to each memory layer in the first memory deck.

In another example, a method for operating a 3D memory device is disclosed. The 3D memory device includes a plurality of memory decks each including a plurality of memory layers in a vertical direction, and a plurality of first dummy memory layers between the first and second memory decks in the vertical direction. Each memory layer in a first memory deck of the plurality of memory decks is first programmed. The first programming includes applying a program voltage to the memory layer and a channel pass voltage smaller than the program voltage to each of the rest of the memory layers in the first memory deck. Each memory layer in a second memory deck of the plurality of memory decks above the first memory deck is second programmed. The second programming includes applying the program voltage to the memory layer and the channel pass voltage to each of the rest of the memory layers in the second memory deck. The second programming also includes applying a 0 V-voltage to at least one of the first dummy memory layers. The second programming further includes applying the 0 V-voltage to each memory layer in the first memory deck.

In still another example, a 3D memory device includes a peripheral circuit and a plurality of memory decks each including a plurality of memory layers in a vertical direction. The peripheral circuit is configured to program each memory layer in a first memory deck of the plurality of memory decks, and then program each memory layer in a second memory deck of the plurality of memory decks above the first memory deck. To program each memory layer in the first memory deck, the peripheral circuit is further configured to apply a program voltage to the memory layer and a first channel pass voltage smaller than the program voltage to each of the rest of the memory layers in the first memory deck. To program each memory layer in the second memory deck, the peripheral circuit is further configured to apply the program voltage to the memory layer and the first channel pass voltage to each of the rest of the memory layers in the second memory deck, and apply a second channel pass voltage smaller than the first channel pass voltage to each memory layer in the first memory deck.

In yet another example, a 3D memory device includes a peripheral circuit, a plurality of memory decks each including a plurality of memory layers in a vertical direction, and a plurality of first dummy memory layers between the first and second memory decks in the vertical direction. The peripheral circuit is configured to program each memory layer in a first memory deck of the plurality of memory decks, and then program each memory layer in a second memory deck of the plurality of memory decks above the first memory deck. To program each memory layer in the first memory deck, the peripheral circuit is further configured to apply a program voltage to the memory layer and a channel pass voltage smaller than the program voltage to each of the rest of the memory layers in the first memory deck. To program each memory layer in the second memory deck, the peripheral circuit is further configured to apply the program voltage to the memory layer and the channel pass voltage to each of the rest of the memory layers in the second memory deck. To program each memory layer in the second memory deck, the peripheral circuit is further configured to apply a 0 V-voltage to at least one of the first dummy memory layers, and apply the 0 V-voltage to each memory layer in the first memory deck.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
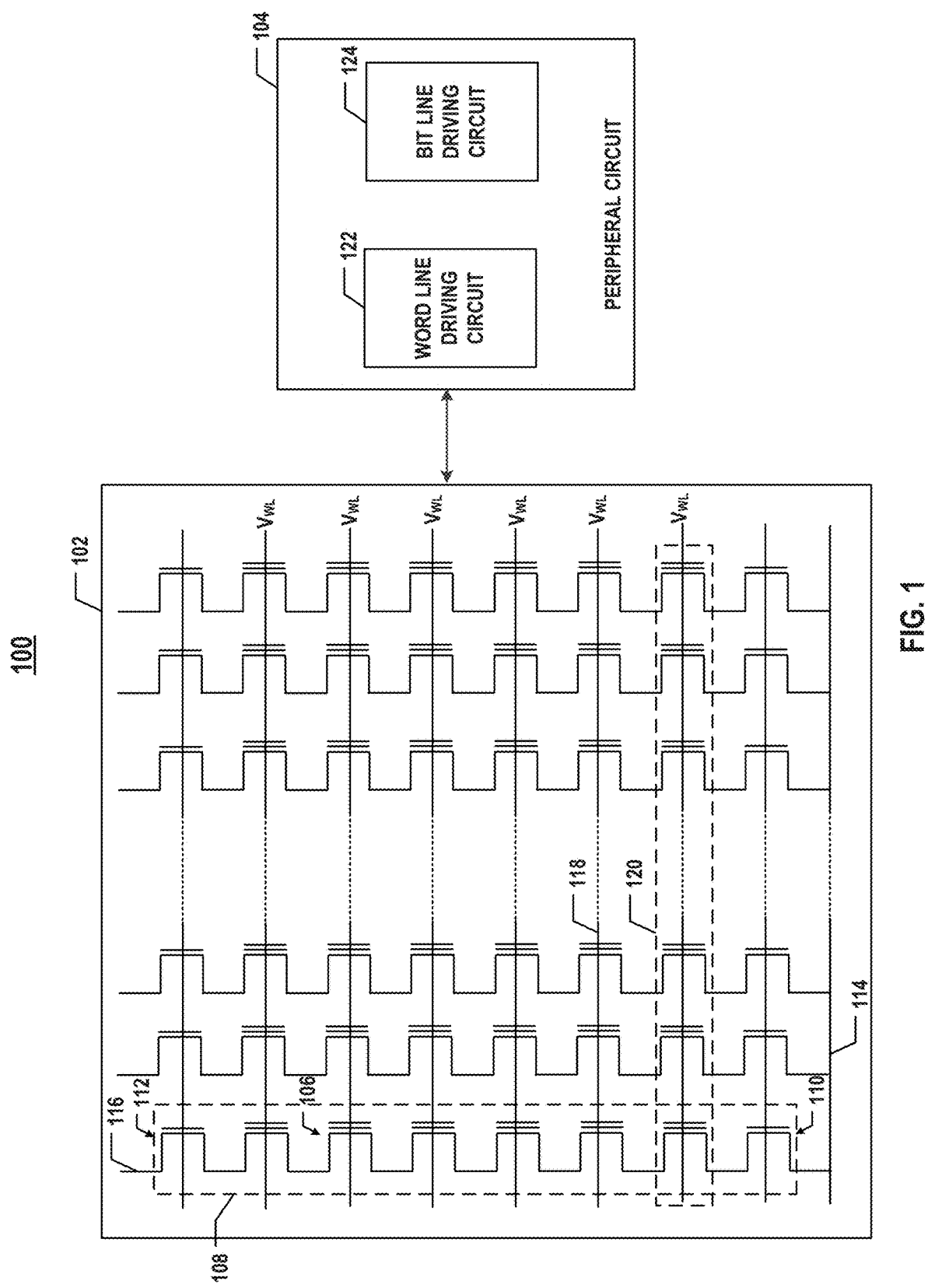
FIG. 1 illustrates a diagram of an exemplary 3D memory device, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

Various embodiments in accordance with the present disclosure provide a novel programming scheme for 3D memory devices, in particular, multi-deck 3D NAND memory devices, with reduced disturbance. For selected 3D NAND memory strings, the programming scheme disclosed herein can reduce the disturbance to the programmed memory layers caused by the channel pass voltage (a.k.a. "channel pass voltage disturbance"). For deselected 3D memory strings, the programming scheme disclosed herein can also reduce the disturbance to the programming memory layer caused by the program voltage (a.k.a. "program voltage disturbance"). During the programming operation of any upper memory deck, each memory layer or dummy memory layer below the upper memory deck can be applied with a reduced channel pass voltage (e.g., 0 V) to reduce the channel pass voltage disturbance and avoid the occurrence of channel coupling effect in the lower region of the deselected NAND memory strings. In some embodiments, at least one of the dummy memory layers between the upper and lower memory decks is cut off, for example, by applying a 0 V-voltage to its control gate, thereby preventing leakage current between the upper and lower memory decks. In some embodiments, a set of voltages gradually decreasing are applied to the dummy memory layers between the upper and lower memory decks to form a voltage gradient from the channel pass voltage to 0 V, which can avoid the channel hot electron injection (CHE) effect in the deselected NAND memory strings.

FIG. 1 illustrates a diagram of an exemplary 3D memory device 100, according to some embodiments of the present disclosure. 3D memory device 100 can include a memory array device 102 and a peripheral circuit 104 coupled to memory array device 102. Memory array device 102 can be a 3D NAND Flash memory device in which memory cells 106 are provided in the form of an array of NAND memory strings 108 each extending vertically above a substrate (not shown). In some embodiments, each NAND memory string 108 includes a plurality of memory cells 106 coupled in series and stacked vertically. Each memory cell 106 can hold a continuous, analog value, such as an electrical voltage or charge, that depends on a number of electrons trapped within a region of memory cell 106. Each memory cell 106 can be either a "floating gate" type of memory cell including a floating-gate transistor or a "charge trap" type of memory cell including a charge-trap transistor.

In some embodiments, each memory cell 106 is a single-level cell (SLC) that has two possible memory states and thus, can store one bit of data. For example, the first memory state "0" can correspond to a first range of voltages, and the second memory state "1" can correspond to a second range of voltages. In some embodiments, each memory cell 106 is a multi-level cell (MLC) that is capable of storing more than a single bit of data in more than four memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MCL stores two bits of data, then the MLC can be programmed to assume one of three possible programming levels from an erased state by writing one of three possible nominal storage values to the cell. A fourth nominal storage value can be used for the erased state.

As shown in FIG. 1, each NAND memory string 108 can include a source select transistor 110 at its source end and a drain select transistor 112 at its drain end. Source select transistor 110 and drain select transistor 112 can be configured to activate selected NAND memory strings 108 (columns of the array) during reading and programming operations. In some embodiments, source select transistors 110 of NAND memory strings 108 in the same memory block are coupled through a same source line 114, e.g., a common source line, for example, to the ground. Drain select transistor 112 of each NAND memory string 108 is coupled to a respective bit line 116 from which data can be read via an output bus (not shown), according to some embodiments. In some embodiments, each NAND memory string 108 is configured to be selected or deselected by applying a select voltage (e.g., above the threshold voltage of drain select transistor 112) or a deselect voltage (e.g., 0 V) to respective drain select transistor 112 while source select transistors 110 are connected to the common ground (i.e., 0 V).

Memory cells 106 of adjacent NAND memory strings 108 can be coupled through word lines 118 that select which row of memory cells is affected by reading and programming operations. In some embodiments, each word line 118 is coupled to a page of memory cells (memory page 120), which is the smallest physically-addressable data unit for reading and programming operations. The size of memory page 120 in bits can correspond to the number of NAND memory strings 108 coupled by word line 118. Each word line 118 can include a plurality of control gates at each memory cell 106 in respective memory page 120 and a gate line coupling the control gates.

Figure 2:
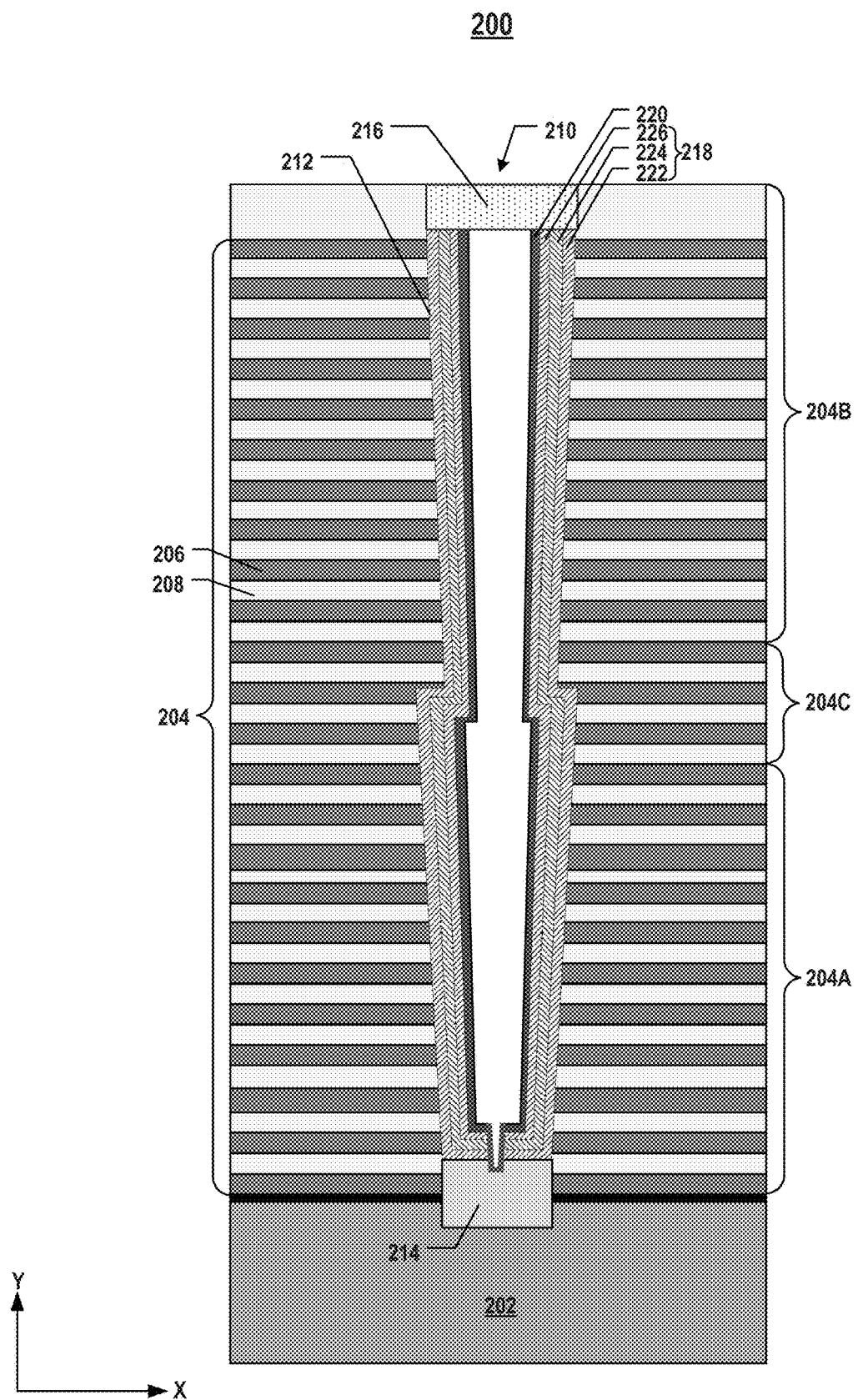
FIG. 2 illustrates a cross-section of an exemplary memory array device, according to some embodiments of the present disclosure.

FIG. 2 illustrates a cross-section of an exemplary memory array device 200, according to some embodiments of the present disclosure. Memory array device 200 is an example of memory array device 102 illustrated in FIG. 1. As shown in FIG. 2, memory array device 200 includes a 3D NAND memory string 210 (e.g., NAND memory string 108 in FIG. 1) extending vertically above a substrate 202. Substrate 202 can include silicon (e.g., single crystalline silicon), silicon germanium (SiGe), gallium arsenide (GaAs), germanium (Ge), silicon on insulator (SOI), germanium on insulator (GOI), or any other suitable materials. It is noted that x and y axes are included in FIG. 2 to further illustrate the spatial relationship of the components in memory array device 200. Substrate 202 includes two lateral surfaces (e.g., a top surface and a bottom surface) extending laterally in the x-direction (i.e., the lateral direction). As used herein, whether one component is "on," "above," or "below" another component of a semiconductor structure (e.g., memory array device 200) is determined relative to the substrate of the semiconductor structure (e.g., substrate 202) in the y-direction (i.e., the vertical direction or depth direction) when the substrate is positioned in the lowest plane of the semiconductor structure in the y-direction. The same notion for describing the spatial relationship is applied throughout the present disclosure.

As shown in FIG. 2, 3D NAND memory string 210 extends vertically through a memory stack 204 having interleaved gate conductive layers 206 (also referred to herein as "memory layers") and gate-to-gate dielectric layers 208 above substrate 202. Gate conductive layers 206 and gate-to-gate dielectric layers 208 in memory stack 204 can alternate in the vertical direction. In other words, except the ones at the top or bottom of memory stack 204, each gate conductive layer 206 can be adjoined by two gate-to-gate dielectric layers 208 on both sides, and each gate-to-gate dielectric layer 208 can be adjoined by two gate conductive layers 206 on both sides. The number of the pairs of gate conductive layers 206 and gate-to-gate dielectric layers 208 in memory stack 204 (e.g., 32, 64, 96, or 128) determines the number of memory cells in memory array device 200. Each gate conductive layer 206 can include conductive materials including, but not limited to, tungsten (W), cobalt (Co), copper (Cu), aluminum (Al), polysilicon, doped silicon, silicides, or any combination thereof. In some embodiments, each gate conductive layer 206 includes a metal layer, such as a tungsten layer. In some embodiments, each gate conductive layer 206 includes a doped polysilicon layer. Each gate conductive layer/memory layer 206 can include control gates surrounding the memory cells (e.g., memory cells 106 in FIG. 1) of 3D NAND memory string 210 and can extend laterally as a word line (e.g., word lines 118 in FIG. 1).

Memory stack 204 can have a multi-deck architecture, such as a dual-deck memory stack including a lower memory deck 204A above substrate 202 and an upper memory deck 204B above lower memory deck 204A, as shown in FIG. 2. The numbers of the pairs of gate conductive layers 206 and gate-to-gate dielectric layers 208 in each of lower and upper memory decks 204A and 204B can be the same or different. Each of lower and upper memory decks 204A and 204B can include interleaved gate conductive layers 206 and gate-to-gate dielectric layers 208 as described above.

As shown in FIG. 2, 3D NAND memory string 210 includes a channel structure 212 extending vertically through lower and upper memory decks 204A and 204B. In some embodiments, channel structure 212 includes a channel hole filled with semiconductor material(s) (e.g., as a semiconductor channel 220) and dielectric material(s) (e.g., as a memory film 218). In some embodiments, semiconductor channel 220 includes silicon, such as amorphous silicon, polysilicon, or single crystalline silicon. In some embodiments, memory film 218 is a composite dielectric layer including a tunneling layer 226, a storage layer 224 (also known as a "charge trap/storage layer"), and a blocking layer 222. Channel structure 212 can have a cylinder shape (e.g., a pillar shape). Semiconductor channel 220, tunneling layer 226, storage layer 224, blocking layer 222 are arranged radially from the center toward the outer surface of the pillar in this order, according to some embodiments. Tunneling layer 226 can include silicon oxide, silicon oxynitride, or any combination thereof. Storage layer 224 can include silicon nitride, silicon oxynitride, silicon, or any combination thereof. Blocking layer 222 can include silicon oxide, silicon oxynitride, high dielectric constant (high-k) dielectrics, or any combination thereof. In one example, memory film 218 can include a composite layer of silicon oxide/silicon oxynitride/silicon oxide (ONO).

In some embodiments, 3D NAND memory string 210 further includes a semiconductor plug 214 in the lower portion (e.g., at the lower end) of 3D NAND memory string 210. Semiconductor plug 214 can include a semiconductor material, such as single-crystal silicon, which is epitaxially grown from substrate 202 in any suitable directions. Semiconductor plug 214 can function as part of the channel of a source select transistor (e.g., source select transistor 110 in FIG. 1) of 3D NAND memory string 210. In some embodiments, 3D NAND memory string 210 further includes a channel plug 216 in the upper portion (e.g., at the upper end) of 3D NAND memory string 210. In some embodiments, channel plug 216 can function as the channel of a drain select transistor (e.g., drain select transistor 112 in FIG. 1) of 3D NAND memory string 210. As used herein, the "upper end" of a component (e.g., channel structure 212) is the end farther away from substrate 202 in the y-direction, and the "lower end" of the component (e.g., channel structure 212) is the end closer to substrate 202 in the y-direction when substrate 202 is positioned in the lowest plane of memory array device 200.

In some embodiments, 3D NAND memory strings 210 include a plurality of control gates (each being part of gate conductive layer/memory layer 206) for memory cells of 3D NAND memory strings 210. Gate conductive layer 206 can include multiple control gates for multiple 3D NAND memory strings 210 and can extend laterally as a word line ending at the edge of memory stack 204, which can receive word line bias voltages $V_{WL}$ (e.g., as shown in FIG. 1) for controlling operations of the memory cells, e.g., by reading, erasing, and programming operations. It is understood that although not shown in FIG. 2, additional components of memory array device 200 can be formed including, but not limited to, gate line slits/source contacts, local contacts, interconnect layers, etc.

In FIG. 2, 3D NAND memory string 210 includes single channel structure 212, which is known as a single-cell formation (SCF) structure. It is understood that in some embodiments, 3D NAND memory string 210 may include two channel structures electrically connected by an inter-deck plug (not shown), which is also known as a dual-cell formation (DCF) structure. It is also understood that in some embodiments, memory stack 204 may include more than two memory decks, and 3D NAND memory string 210 may include a single channel structure extending vertically through the memory decks or include more than two channel structures, each of which extends vertically through a respective one of the memory decks. For a 3D memory device having a multi-deck memory stack, each of the multiple memory decks can include a plurality of memory layers (e.g., gate conductive layers 206) in the vertical direction. In some embodiments, a set of dummy memory layers are formed vertically between adjacent memory decks, such as dummy memory layers 204C vertically between lower and upper memory decks 204A and 204B as shown in FIG. 2, or dummy memory layers (not shown) surrounding the inter-deck plug in a DCF structure. A dummy memory layer can have the same physical structure, but different electrical configuration, as a memory layer because the memory cells coupled by the dummy memory layer are not used for data storage (i.e., as dummy memory cells).

Referring back to FIG. 1, peripheral circuit 104 can include any suitable digital, analog, and/or mixed-signal circuits used for facilitating the operations of 3D memory device 100. For example, peripheral circuit 104 can include one or more of a data buffer (e.g., a bit line page buffer), a decoder (e.g., a row decoder or a column decoder), a sense amplifier, a driver (e.g., a word line driver), a charge pump, a current or voltage reference, or any active or passive components of the circuits (e.g., transistors, diodes, resistors, or capacitors). In some embodiments, peripheral circuit 104 is formed using complementary metal-oxide-semiconductor (CMOS) technology.

In some embodiments, peripheral circuit 104 includes a word line driving circuit 122 and a bit line driving circuit 124. Word line driving circuit 122 can implement the programming schemes disclosed herein for programming memory cells 106 in memory array device 102. The waveform of the programming scheme can be provided by peripheral circuit 104 to each memory page 120 through word lines 118 in the form of word line bias voltages $V_{WL}$. As described below in detail, the word line bias voltages $V_{WL}$ that can be applied to word lines 118 include program voltage $V_{program}$, channel pass voltage $V_{pass}$, cut-off voltage $V_{cut}$, etc. Bit line driving circuit 124 can select or deselect NAND memory string 108 (and memory cells 106 thereof) by applying a select voltage or a deselect voltage to respective drain select transistor 112 via respective bit line 116 for various memory operations, such as programming of selected memory cells 106.

Figure 3A:
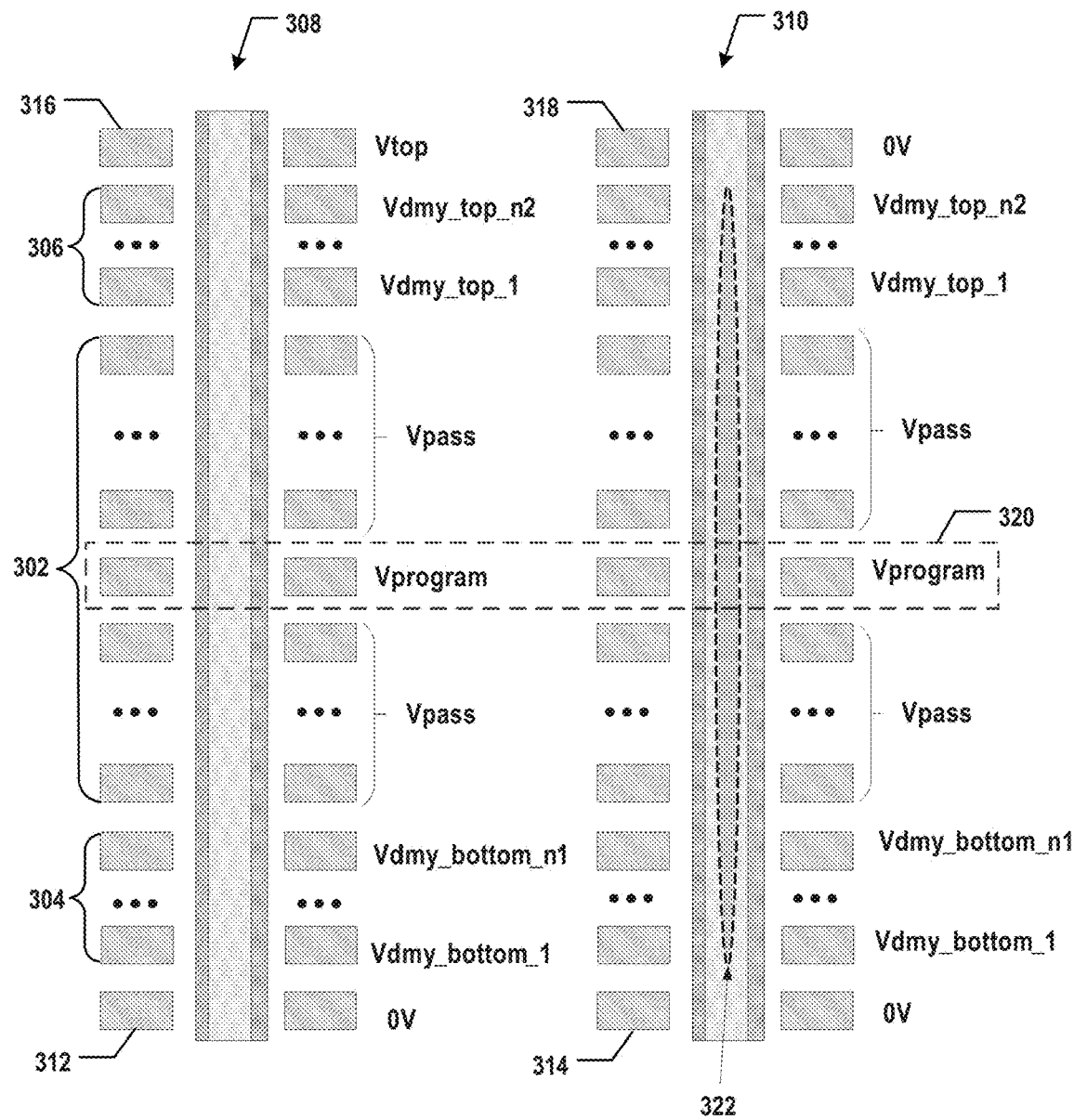
FIG. 3A illustrates a programming scheme for a single-deck 3D NAND memory device.

FIG. 3A illustrates a programming scheme for a single-deck 3D NAND memory device 300. 3D NAND memory device 300 includes a memory stack 302 having a plurality of memory layers (e.g., gate conductive layers) in the vertical direction acting as the word lines of 3D NAND memory device 300. 3D NAND memory device 300 further includes a set of lower dummy memory layers 304 below memory stack 302 and a set of upper dummy memory layers 306 above memory stack 302. As shown in FIG. 3A, 3D NAND memory device 300 also includes a plurality of NAND memory strings 308 and 310 each extending vertically through memory stack 302. Each NAND memory string 308 or 310 includes a source select transistor 312 or 314, respectively, below lower dummy memory layers 304. Each NAND memory string 308 or 310 also includes a drain select transistor 316 or 318, respectively, above upper dummy memory layers 306.

During the programming operation of 3D NAND memory device 300, a 0 V-voltage is applied to both source select transistors 312 and 314 of each NAND memory string 308 or 310, for example, by electrically coupling source select transistors 312 and 314 to a common ground. During the programming operation of 3D NAND memory device 300, a select voltage $V_{top}$ is applied to drain select transistor 316 of NAND memory string 308 to select NAND memory string 308 (i.e., activating the memory cells in NAND memory string 308), and a deselect voltage (e.g., 0 V) is applied to drain select transistor 318 of NAND memory string 310 to deselect NAND memory string 310 (i.e., deactivating the memory cells in NAND memory string 308).

During the programming operation of 3D NAND memory device 300, each memory layer in memory stack 302 is sequentially programmed by subsequently applying a program voltage $V_{program}$ to each memory layer. For example, when programming a memory layer 320, the program voltage is applied to memory layer 320 to program the memory cell of selected NAND memory string 308 surrounded by memory layer 320. When programming memory layer 320, each of the rest of the memory layers in memory stack 302 is applied with a channel pass voltage $V_{pass}$ to open the channel (e.g., semiconductor channel 220 in FIG. 2) of selected NAND memory string 308, which enables the programming of memory layer 320. During the programming operation of 3D NAND memory device 300, a set of voltages are applied to each set of lower or upper dummy memory layers 304 or 306. As shown in FIG. 3A, a set of voltages $V_{dmy\_bottom\_1}$-$V_{dmy\_bottom\_n1}$ are respectively applied to lower dummy memory layers 304, and another set of voltages $V_{dmy\_top\_1}$-$V_{dmy\_top\_n1}$ are respectively applied to upper dummy memory layers 306.

During the programming operation of 3D NAND memory device 300, for deselected NAND memory string 310, because drain select transistor 318 and source select transistor 314 at each end thereof are turned off, the channel of deselected NAND memory string 310 is in a floating state. As each memory layer of memory stack 302 surrounds deselected NAND memory string 310 as well, the channel pass voltage applied to each of the rest of the memory layers in memory stack 302 forms a coupling potential 322 in deselected NAND memory string 310 to suppress the programming of memory layer 320 in deselected NAND memory string 310 due to the program voltage applied to memory layer 320. Coupling potential 322 is formed by channel coupling effect in deselected NAND memory string 310, which is in the floating state, when the channel pass voltage is applied to the rest of the memory layers in memory stack 302. To achieve the desired suppression effect on the program voltage applied to memory layer 320, the channel pass voltage needs to be large enough to generate coupling potential 322 that is comparable to the program voltage. However, for selected NAND memory string 308, the channel pass voltage applied to a memory layer that has already been programmed (e.g., each memory layer below memory layer 320) may cause disturbance to the programmed memory cells if the channel pass voltage is too high, which is known as the "channel pass voltage disturbance" to selected NAND memory string 308. On the other hand, for deselected NAND memory string 310, if the program voltage is too high, coupling potential 322 may not effectively suppress the programming to the memory cell in deselected NAND memory string 310, which is known as the "program voltage disturbance" to deselected NAND memory string 310.

Figure 3B:
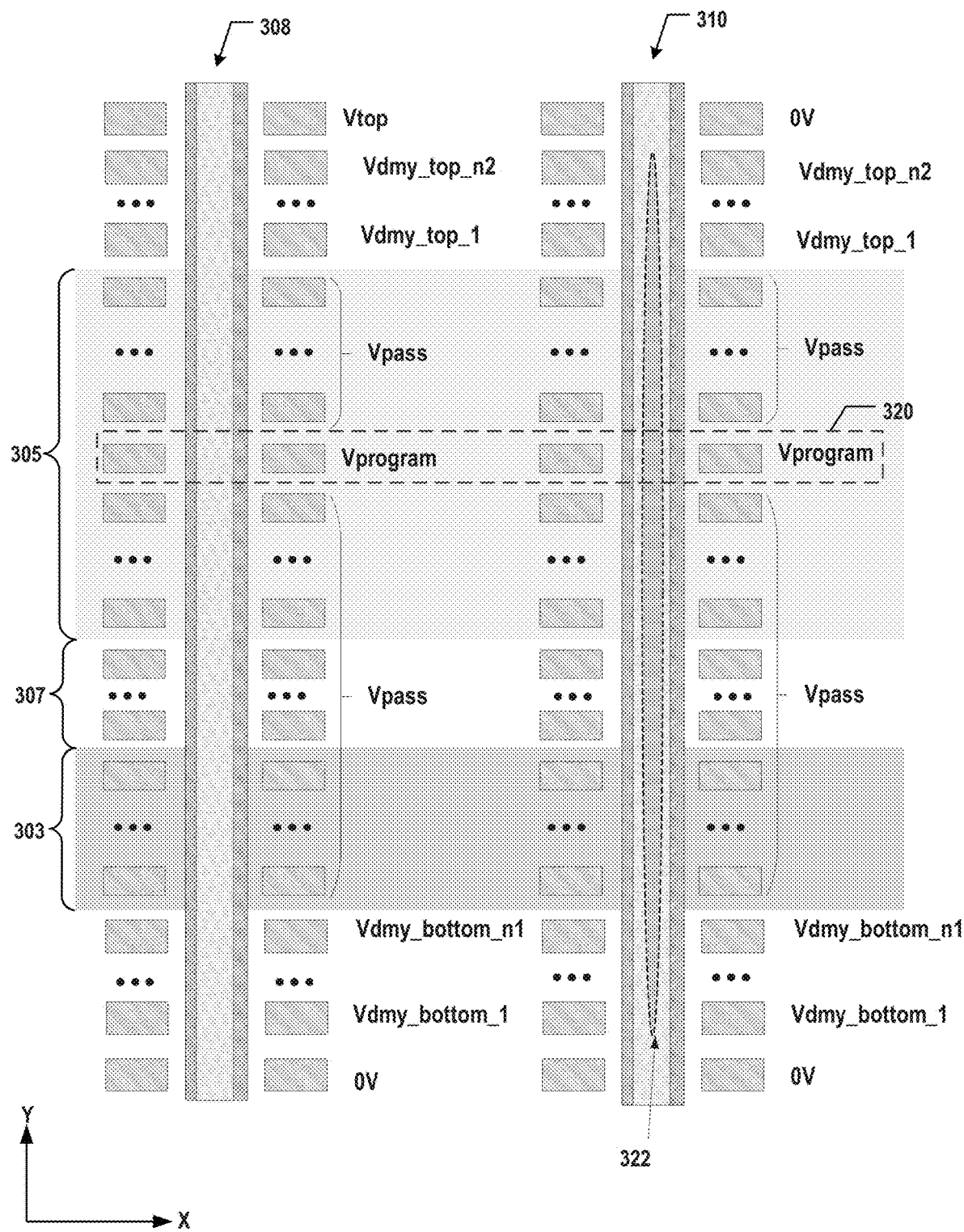
FIG. 3B illustrates a programming scheme for a multi-deck 3D NAND memory device.

As the number of stacked memory layers continues increasing in 3D NAND memory devices, the channel pass voltage disturbance becomes more significant as the duration when the channel pass voltage is applied to a programmed memory layer also increases. At the same time, the program voltage disturbance becomes more significant as well because the channel depth (in the vertical direction) increases, thereby reducing the coupling potential. For example, FIG. 3B illustrates a programming scheme for a multi-deck 3D NAND memory device 301. Different from 3D NAND memory device 300 in FIG. 3A, 3D NAND memory device 301 further includes a lower memory deck 303, an upper memory deck 305 above lower memory deck 303, and a set of middle dummy memory layers 307 vertically between lower and upper memory decks 303 and 305, which increases the number of memory cells in 3D NAND memory device 301.

The memory layers in lower memory deck 303 are first programmed. When programming memory layer 320 in upper memory deck 305, the program voltage $V_{program}$ is applied to memory layer 320, which causes the program voltage disturbance in deselected NAND memory string 310. As the channel depth in the y-direction in multi-deck 3D NAND memory device 301 is larger than the channel depth in single-deck 3D NAND memory device 300, coupling potential 322, which extends into both lower and upper memory decks 303 and 305 as well as middle dummy memory layers 307 in deselected NAND memory string 310, becomes smaller in multi-deck 3D NAND memory device 301. Thus, the program voltage disturbance becomes more significate in multi-deck 3D NAND memory device 301. On the other hand, when programming memory layer 320 in upper memory deck 305, the channel pass voltage$_{pass}$ is applied to each of the rest of memory layers in upper memory deck 305, each of middle dummy memory layers 307, and each of the memory layers in lower memory deck 303, thereby causing the channel pass voltage disturbance to selected NAND memory string 308, in particular, the memory layers in lower memory deck 303 that have already been programmed. Because duration when the channel pass voltage is applied to each programmed memory layer in lower memory deck 303 increases due to the increased number of memory layers, the channel pass voltage disturbance becomes more significate in multi-deck 3D NAND memory device 301 as well.

Figure 4:
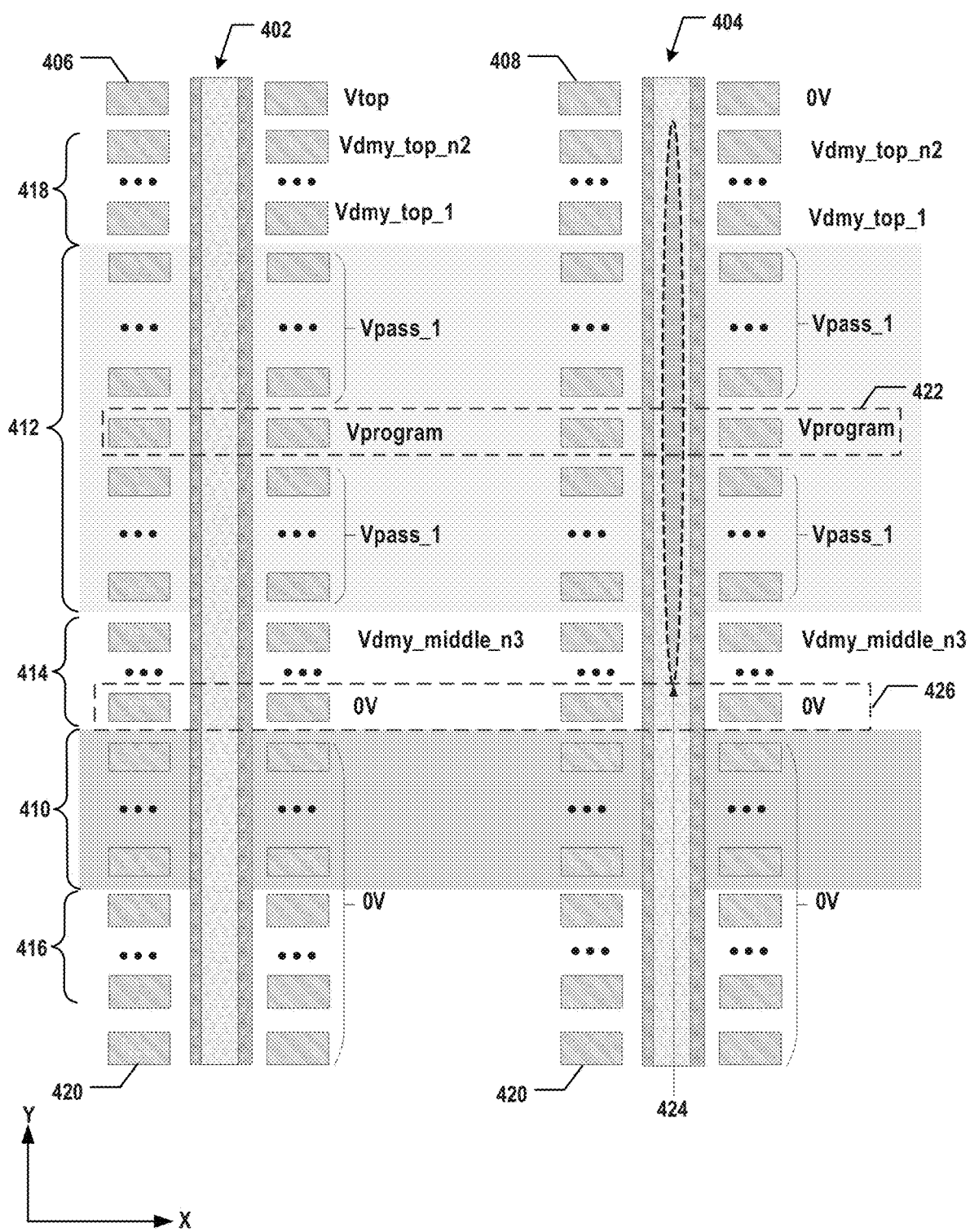
FIG. 4 illustrates an exemplary programming scheme for a multi-deck 3D NAND memory device, according to some embodiments of the present disclosure.

As described below in detail with respect to FIGS. 4-7, the present disclosure provides a novel programming scheme with reduced disturbance (e.g., program voltage disturbance and channel pass voltage disturbance) for 3D memory devices, in particular, for 3D NAND memory devices having multiple memory decks. FIG. 4 illustrates an exemplary programming scheme for a multi-deck 3D NAND memory device 400, according to some embodiments of the present disclosure. The physical structure of 3D NAND memory device 400 is similar to that of 3D NAND memory device 301 in FIG. 3B and thus, may not be repeated herein in detail.

As shown in FIG. 4, 3D NAND memory device 400 includes a selected NAND memory string 402 and a deselected NAND memory string 404. To select NAND memory string 402, a select voltage $V_{top}$ can be applied to a drain select transistor 406 of NAND memory string 402. To turn on drain select transistor 406, the select voltage can be any suitable voltage greater than the threshold voltage of drain select transistor 406. To deselect NAND memory string 404, a deselect voltage can be applied to a drain select transistor 408 of NAND memory string 404. To turn off drain select transistor 408, the deselect voltage can be any suitable voltage smaller than the threshold voltage of drain select transistor 408, such as 0 V.

As shown in FIG. 4, 3D NAND memory device 400 also includes a lower memory deck 410, an upper memory deck 412 above lower memory deck 410, and a set of middle dummy memory layers 414 vertically between lower and upper memory decks 410 and 412. Each of selected and deselected NAND memory strings 402 and 404 can extend vertically through lower and upper memory decks 410 and 412 and form memory cells at the intersections thereof. In some embodiments, 3D NAND memory device 400 further includes a set of lower dummy memory layers 416 vertically between a source select transistor 420 and lower memory deck 410, and a set of upper dummy memory layers 418 vertically between drain select transistors 406 and 408 and upper memory deck 412.

During the programming operation of 3D NAND memory device 400, each memory layer in lower memory deck 410 is first sequentially programmed in a programming order. In some embodiments, the programming order is bottom-up, i.e., from the bottom memory layer to the top memory layer, in lower memory deck 410. It is understood that any other suitable programming order may be applied in other embodiments. To program lower memory deck 410, a program voltage $V_{program}$ can be subsequently applied to each memory layer in the programming order, and a first channel pass voltage $V_{pass\_1}$ can be applied to each of the rest of the memory layers in lower memory deck 410. The program voltage can be greater than the threshold voltage of the control gate of the memory cell and also high enough to inject electrons into the memory film (e.g., the ONO structure of memory film 218 in FIG. 2) of selected NAND memory string 402. For example, the program voltage may be about 20 V, such as 20 V. The first channel pass voltage can be greater than the threshold voltage of the control gate of the memory cell to open the channel (e.g., semiconductor channel 220 in FIG. 2) of selected NAND memory string 402. In some embodiments, the first channel pass voltage is smaller than the program voltage. For example, the first channel pass voltage may be about 8 V, 9 V, or 10 V, such as 8 V, 9 V, or 10 V. It is understood that in some embodiments, the programming scheme for lower memory deck 410 may be substantially similar to that for lower memory deck 303 of 3D NAND memory device 301 in FIG. 3B.

During the programming operation of 3D NAND memory device 400, assuming the programming order of memory decks 410 and 412 is bottom-up, each memory layer in upper memory deck 412 is then sequentially programmed in a programming order. In some embodiments, the programming order is bottom-up, i.e., from the bottom memory layer to the top memory layer, in upper memory deck 412. It is understood that any other suitable programming order may be applied in other embodiments. To program upper memory deck 412, the program voltage $V_{program}$ can be subsequently applied to each memory layer 422 in the programming order, and the first channel pass voltage $V_{pass\_1}$ can be applied to each of the rest of the memory layers in upper memory deck 412. Different from conventional programming scheme for upper memory deck 305 described above in FIG. 3B in which the same channel pass voltage is applied to each programmed memory layer in lower memory deck 303 while programming upper memory deck 305, to program memory layer 422 in upper memory deck 412, a second channel pass voltage smaller than the first channel pass voltage is applied to each programmed memory layer in lower memory deck 410. As shown in FIG. 4, the second channel pass voltage can be about 0 V, such as 0 V. By applying a reduced channel pass voltage (e.g., 0 V) to the programmed memory layers in lower memory deck 410 when programming upper memory deck 412, the channel pass voltage disturbance to selected NAND memory string 402 can be reduced.

On the other hand, when the channel pass voltage is reduced to be below the threshold voltage of the control gate of the memory cell (e.g., 0 V), a partial coupling potential 424 in deselected NAND memory string 404 cannot extend into lower memory deck 410. Compared with coupling potential 322 extending into both lower and upper memory decks 303 and 305 in deselected NAND memory string 310 in FIG. 3B, the dimension of partial coupling potential 424 in the vertical direction is decreased, according to some embodiments. As a result, the strength of partial coupling potential 424 can be increased, thereby suppressing the program voltage disturbance to deselected NAND memory string 404.

In some embodiments, to reduce the leakage current between lower and upper memory decks 410 and 412 when programming upper memory deck 412, a cut-off voltage smaller than the threshold voltage of the control gate of the memory cell is applied to the control gate of at least one of middle dummy memory layers 414 to turn off the control gate. The cut-off voltage is about 0 V, such as 0 V, according to some embodiments. As shown in FIG. 4, the cut-off voltage (e.g., 0 V) can be applied to a lowest middle dummy memory layer 426. In some embodiments, lowest middle dummy memory layer 426 is first applied with the program voltage (above the threshold voltage) and then switched to the cut-off voltage (below the threshold voltage) to turn off the control gate thereof. In some embodiments, the cut-off voltage is applied to two or more middle dummy memory layer 414.

A set of voltages are applied to a set of middle dummy memory layers 414 above the at least one dummy memory layer, such as lowest middle dummy memory layer 426, according to some embodiments. To avoid the CHE effect in deselected NAND memory string 404, the set of voltages can gradually decrease from the first channel pass voltage $V_{pass\_1}$ to the cut-off voltage (e.g., 0 V). As shown in FIG. 4, the voltage $V_{dmy\_middle\_n3}$ applied to the highest one of middle dummy memory layer 414 can be nominally the same as or slightly smaller than the first channel pass voltage, and the voltage applied to lowest middle dummy memory layer 426 can be about 0 V, such as 0 V. The voltage offsets between adjacent middle dummy memory layers 414 can be the same or different. In some embodiments, to form a voltage gradient above the cut-off voltage, there are at least two middle dummy memory layers 414 above the one to which the cut-off voltage is applied.

Figure 5A:
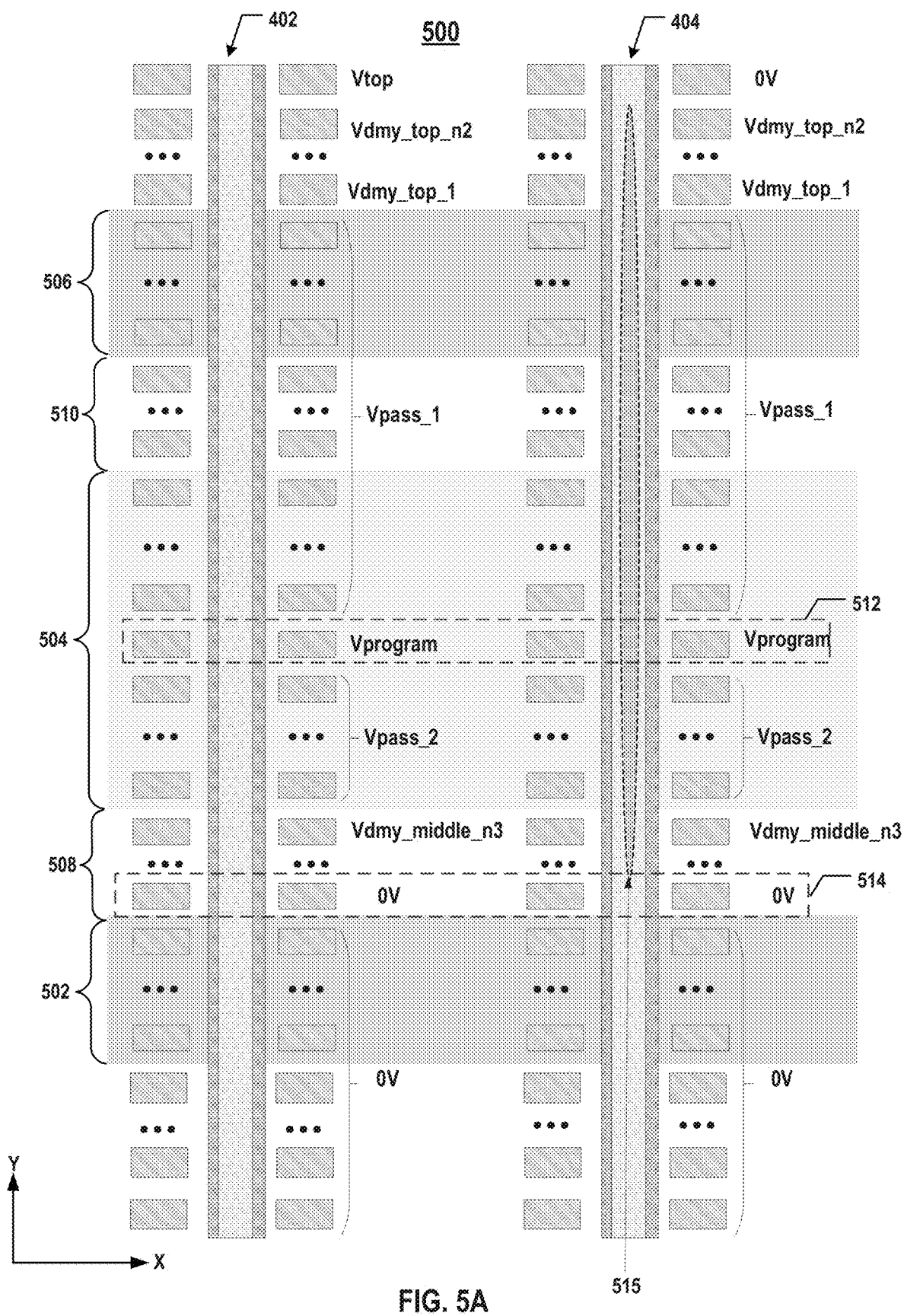
FIGS. 5A and 5B illustrate another exemplary programming scheme for a multi-deck 3D NAND memory device, according to some embodiments of the present disclosure.
Figure 5B:
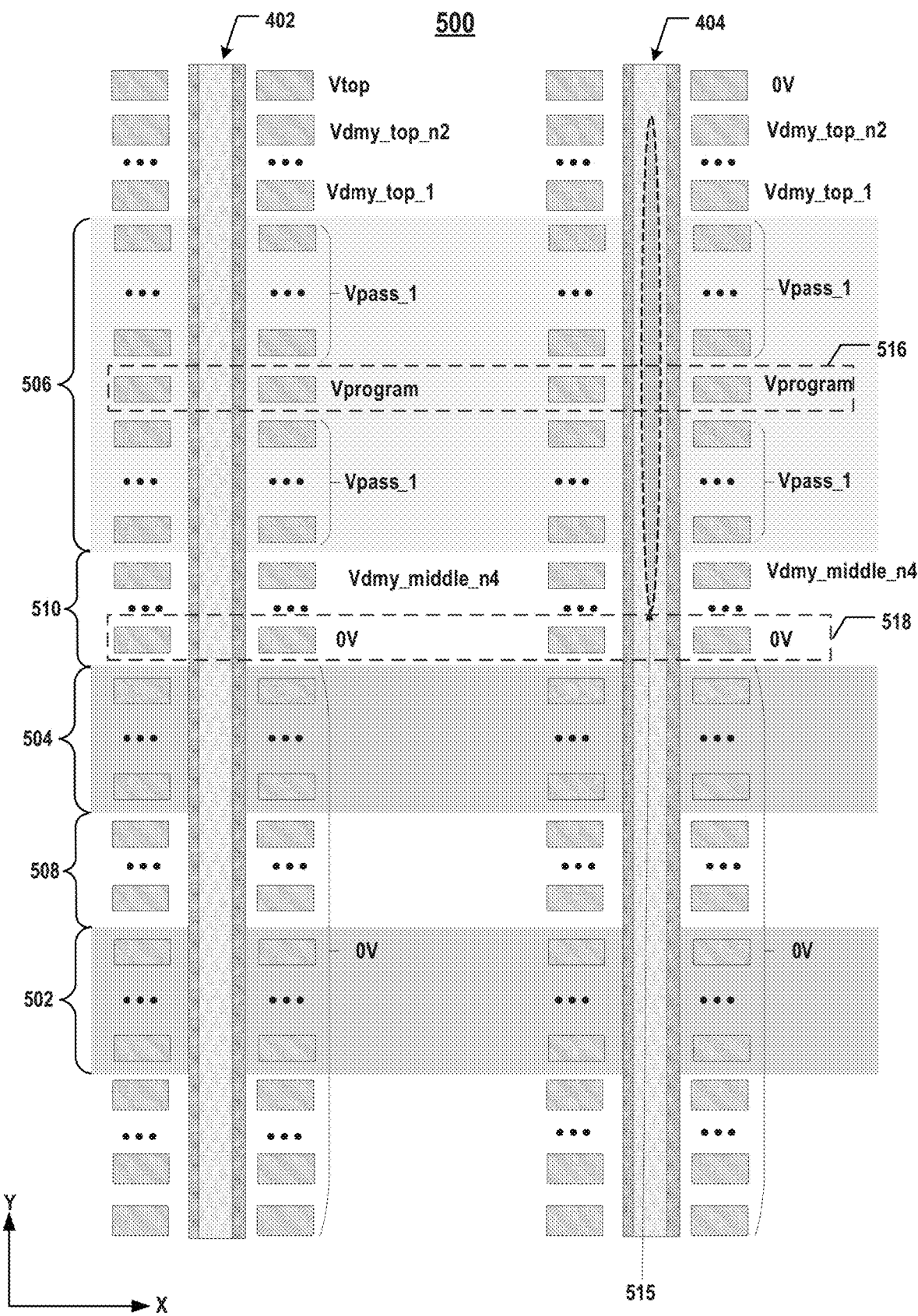

The programming scheme described above with respect to 3D NAND memory device 400 having two memory decks can be extended to 3D NAND memory device having more than two memory decks. For example, FIGS. 5A and 5B illustrate another exemplary programming scheme for a multi-deck 3D NAND memory device 500, according to some embodiments of the present disclosure. As shown in FIGS. 5A and 5B, 3D NAND memory device 500 includes a lower memory deck 502, a middle memory deck 504 above lower memory deck 502, and an upper memory deck 506 above middle memory deck 504 in the vertical direction. 3D NAND memory device 500 can further include a set of first middle dummy memory layers 508 vertically between lower and middle memory decks 502 and 504, as well as a set of second middle dummy memory layers 510 vertically between middle and upper memory decks 504 and 506. The remaining physical components of 3D NAND memory device 500 are similar to their counterparts of 3D NAND memory device 400 in FIG. 4 and thus, may not be repeated herein in detail.

During the programming operation of 3D NAND memory device 500, each memory layer in lower memory deck 502 is first sequentially programmed in a programming order. It is understood that the programming scheme for lower memory deck 502 may be substantially similar to that for lower memory deck 410 of 3D NAND memory device 400 in FIG. 4 and thus, may not be repeated herein in detail. Assuming the programming order of memory decks 502, 504, and 506 is bottom-up, during the programming operation of 3D NAND memory device 500, each memory layer in middle memory deck 504 is then sequentially programmed in a programming order, e.g., bottom-up. To program a memory layer 512 in middle memory deck 504, a program voltage $V_{program}$ can be applied to memory layer 512, a first channel pass voltage $V_{pass\_1}$ can be applied to each of the rest of the memory layers in middle memory deck 504 that is above memory layer 512, and a second channel pass voltage $V_{pass\_2}$ can be applied to each of the rest of the memory layers in middle memory deck 504 that is below memory layer 512. In some embodiments, when programming middle memory deck 504, the first channel pass voltage is applied to each memory layer in upper memory deck 506 and each second middle dummy memory layer 510 as well. The first channel pass voltage $V_{pass\_1}$ can be nominally the same as the second channel pass voltage $V_{pass\_2}$.

To program memory layer 512 in middle memory deck 504, a third channel pass voltage smaller than the first and channel pass voltages is applied to each programmed memory layer in lower memory deck 502, according to some embodiments. The third channel pass voltage can be about 0 V, such as 0 V. By applying a reduced channel pass voltage (e.g., 0 V) to the programmed memory layers in lower memory deck 502 when programming middle memory deck 504, both the channel pass voltage disturbance to selected NAND memory string 402 and the program voltage disturbance to deselected NAND memory string 404 can be reduced as described above in detail with respect to FIG. 4.

In some embodiments, to reduce the leakage current between lower and middle memory decks 502 and 504 when programming middle memory deck 504, a cut-off voltage smaller than the threshold voltage of the control gate of the memory cell is applied to the control gate of at least one of first middle dummy memory layers 508 (e.g., a lowest first middle dummy memory layer 514) to turn off the control gate. The cut-off voltage can be about 0 V, such as 0 V. To avoid the CHE effect in deselected NAND memory string 404, a set of voltages that gradually decrease from the second channel pass voltage $V_{pass\_2}$ to the cut-off voltage (e.g., 0 V) can be applied to a set of first middle dummy memory layers 508 above the at least one first middle dummy memory layer (e.g., lowest first middle dummy memory layer 514).

Similarly, in FIG. 5B, during the programming operation of 3D NAND memory device 500, each memory layer in upper memory deck 506 is then sequentially programmed in a programming order, e.g., bottom-up. To program a memory layer 516 in upper memory deck 506, the program voltage $V_{program}$ can be applied to memory layer 516, the first channel pass voltage $V_{pass\_1}$ can be applied to each of the rest of the memory layers in upper memory deck 506, and the third channel pass voltage (e.g., 0 V) can be applied to each programmed memory layer in lower and middle memory decks 502 and 504 as well as to each first middle dummy memory layer 508. In some embodiments, by applying the third channel pass voltage that is smaller than the threshold voltage of the control gate of memory cells to each memory layer in lower and middle memory decks 502 and 504, a partial coupling potential 515 can be further limited in deselected NAND memory string 404 and cannot extend into middle and lower memory decks 504 and 502.

In some embodiments, to reduce the leakage current between middle and upper memory decks 504 and 506 when programming upper memory deck 506, the cut-off voltage is applied to the control gate of at least one of second middle dummy memory layers 510 (e.g., a lowest second middle dummy memory layer 518) to turn off the control gate. To avoid the CHE effect in deselected NAND memory string 404, a set of voltages that gradually decrease from the first channel pass voltage $V_{pass\_1}$ to the cut-off voltage (e.g., 0 V) can be applied to a set of second middle dummy memory layers 510 above the at least one second middle dummy memory layer (e.g., lowest second middle dummy memory layer 518).

Figure 6:
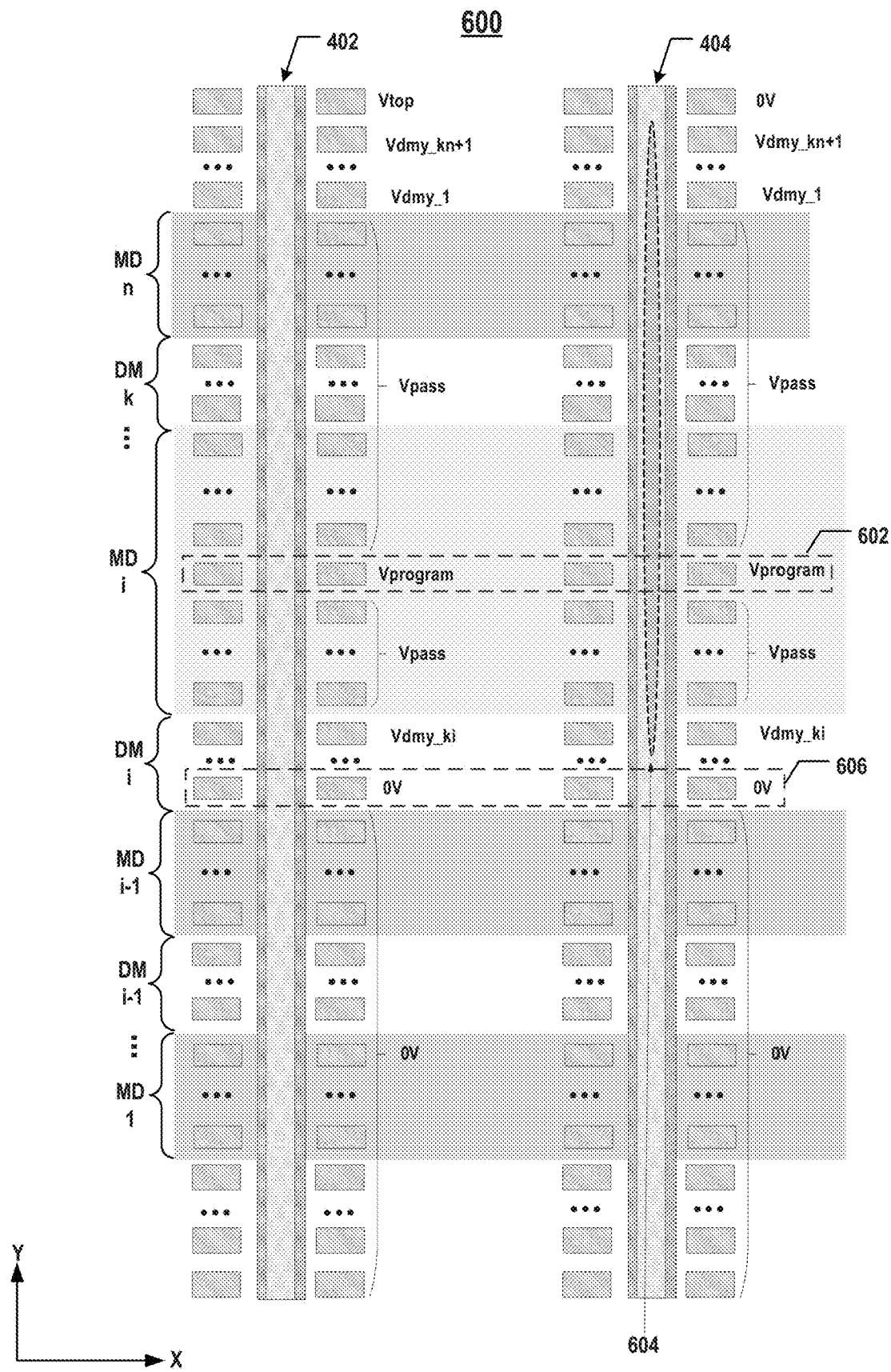
FIG. 6 illustrates still another exemplary programming scheme for a multi-deck 3D NAND memory device, according to some embodiments of the present disclosure.

The programming scheme described above with respect to 3D NAND memory devices having two or three memory decks in FIGS. 4, 5A, and 5B can be extended to any 3D NAND memory device having n memory decks, where n is a positive integer greater than 1 For example, FIG. 6 illustrates still another exemplary programming scheme for a multi-deck 3D NAND memory device 600, according to some embodiments of the present disclosure. As shown in FIG. 6, 3D NAND memory device 600 includes n memory decks (e.g., MD 1, . . . , MD i−1, MD i, . . . , MD n) in the vertical direction. 3D NAND memory device 600 can further include k sets of middle dummy memory layers (e.g., DM 1, . . . , DM i−1, DM i, . . . , DM k), each of which is vertically between two adjacent memory decks. The remaining physical components of 3D NAND memory device 600 are similar to their counterparts of 3D NAND memory device 400 in FIG. 4 and thus, may not be repeated herein in detail.

Assuming the programming order of n memory decks is bottom-up, during the programming operation of 3D NAND memory device 600, each memory layer in MD 1 (the lowest memory deck) is first sequentially programmed in a programming order. It is understood that the programming scheme for MD 1 may be substantially similar to that for lower memory deck 410 of 3D NAND memory device 400 in FIG. 4 and thus, may not be repeated herein in detail. As shown in FIG. 6, when programming a memory layer 602 in MD i (i.e., any memory deck above MD 1), a program voltage $V_{program}$ can be applied to memory layer 602, a channel pass voltage $V_{pass}$ can be applied to each of the rest of the memory layers in MD i as well as to each memory layer in MD i+1 to MD n (i.e., any memory deck above MD i). In some embodiments, when programming MD i, a 0 V-voltage is applied to each memory layer in MD 1 to MD i−1 (i.e., any memory deck below MD i) as well as to each DM 1 to DM i−1 (i.e., any middle dummy memory layers below MD i−1). As a result, a partial coupling potential 604 cannot extend into MD 1 to MD i−1 (i.e., any memory deck below MD i). By applying the 0 V-voltage to the programmed memory layers in MD 1 to MD i−1 when programming MD i, both the channel pass voltage disturbance to selected NAND memory string 402 and the program voltage disturbance to deselected NAND memory string 404 can be reduced as described above in detail with respect to FIG. 4.

In some embodiments, to reduce the leakage current between MD i and MD i−1 when programming MD i, a 0 V-voltage is applied to the control gate of at least one of DM i (e.g., a lowest DM i 606) to turn off the control gate. To avoid the CHE effect in deselected NAND memory string 404, a set of voltages that gradually decrease from the channel pass voltage $V_{pass}$ to 0 V can be applied to DM i above the at least one DM i (e.g., lowest DM i 606). It is understood that in some embodiments, the 0 V cut-off voltage may be applied to any one of DM 1 to DM i (i.e., any middle dummy memory layer below MD i).

Figure 7:
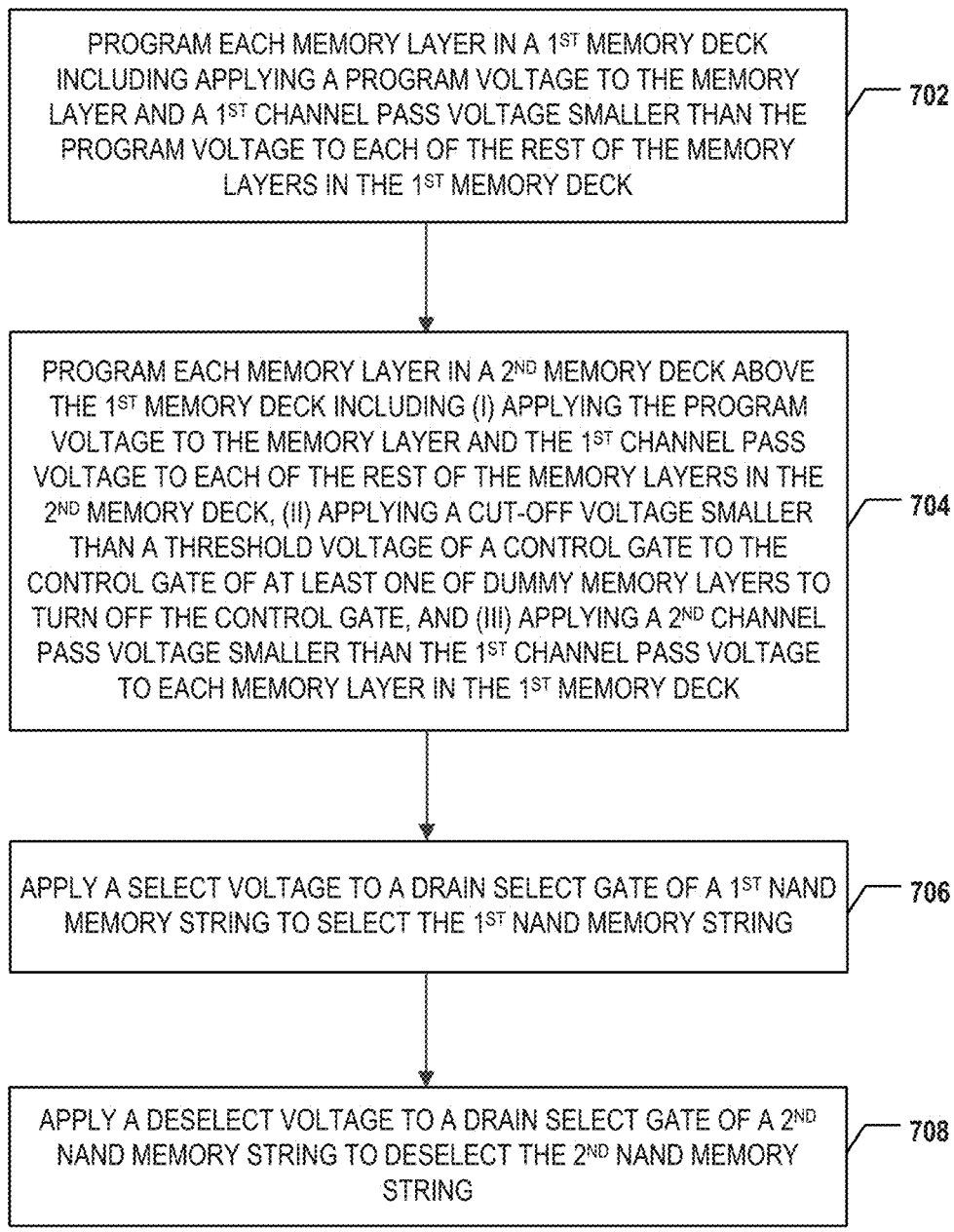
FIG. 7 is a flowchart of an exemplary method for operating a 3D memory device, according to some embodiments of the present disclosure.

FIG. 7 is a flowchart of an exemplary method 700 for operating a 3D memory device, according to some embodiments of the present disclosure. Examples of the 3D memory device depicted in FIG. 7 include 3D NAND memory devices 400, 500, and 600 depicted in FIGS. 4, 5A, 5B, and 6, respectively. It is understood that the operations shown in method 700 are not exhaustive and that other operations can be performed as well before, after, or between any of the illustrated operations. Further, some of the operations may be performed simultaneously, or in a different order than shown in FIG. 7.

Referring to FIG. 7, method 700 starts at operation 702, in which each memory layer in a first memory deck of a plurality of memory decks is programmed. The first programming includes applying a program voltage to the memory layer and a first channel pass voltage smaller than the program voltage to each of the rest of the memory layers in the first memory deck. In some embodiments, the first programming operation is performed by peripheral circuit 104 (e.g., word line driving circuit 122) via word lines 118.

Method 700 proceeds to operation 704, as illustrated in FIG. 7, in which each memory layer in a second memory deck of the plurality of memory decks above the first memory deck is programmed. The second programming includes applying the program voltage to the memory layer and the first channel pass voltage to each of the rest of the memory layers in the second memory deck. The second programming also includes applying a second channel pass voltage smaller than the first channel pass voltage to each memory layer in the first memory deck. In some embodiments, the second programming further includes applying a cut-off voltage smaller than a threshold voltage of a control gate to the control gate of at least one of dummy memory layers to turn off the control gate. Each of the second channel pass voltage and the cut-off voltage is 0 V, according to some embodiments. In some embodiments, the second programming operation is performed after the first programming operation by peripheral circuit 104 (e.g., word line driving circuit 122) via word lines 118.

Method 700 proceeds to operation 706, as illustrated in FIG. 7, in which a select voltage is applied to a drain select transistor of a first NAND memory string to select the first NAND memory string. Method 700 proceeds to operation 708, as illustrated in FIG. 7, in which a deselect voltage is applied to a drain select transistor of a second NAND memory string to deselect the second NAND memory string. In some embodiments, the first channel pass voltage is applied to each of the rest of the memory layers in the second memory deck, and the second channel pass voltage is applied to each memory layer in the first memory deck, such that a partial coupling potential in the deselected second NAND memory string does not extend to the first memory deck. In some embodiments, the selection and deselection operations are performed by peripheral circuit 104 (e.g., bit line driving circuit 124) via bit lines 116.

According to one aspect of the present disclosure, a method for operating a 3D memory device is disclosed. The 3D memory device includes a plurality of memory decks each including a plurality of memory layers in a vertical direction. Each memory layer in a first memory deck of the plurality of memory decks is first programmed. The first programming includes applying a program voltage to the memory layer and a first channel pass voltage smaller than the program voltage to each of the rest of the memory layers in the first memory deck. Each memory layer in a second memory deck of the plurality of memory decks above the first memory deck is second programmed. The second programming includes applying the program voltage to the memory layer and the first channel pass voltage to each of the rest of the memory layers in the second memory deck. The second programming further includes applying a second channel pass voltage smaller than the first channel pass voltage to each memory layer in the first memory deck.

In some embodiments, the 3D memory device includes a third memory deck between the first and second memory decks and a plurality of dummy memory layers between the first and third memory decks in the vertical direction. The second programming further includes applying the second channel pass voltage to each of the memory layers in the third memory deck and the dummy memory layers, according to some embodiments.

In some embodiments, the second channel pass voltage is about 0 V.

In some embodiments, the 3D memory device includes a plurality of NAND memory strings each extending vertically through the plurality of memory decks and each including a drain select transistor. A select voltage can be applied to the drain select transistor of a first NAND memory string of the NAND memory strings to select the first NAND memory string. A deselect voltage can be applied to the drain select transistor of a second NAND memory string of the NAND memory strings to deselect the second NAND memory string. In some embodiments, the first channel pass voltage is applied to each of the rest of the memory layers in the second memory deck and the second channel pass voltage is applied to each memory layer in the first memory deck, such that a partial coupling potential in the deselected second NAND memory string does not extend to the first memory deck.

In some embodiments, the 3D memory device further includes a plurality of dummy memory layers between the first and second memory decks in the vertical direction. A cut-off voltage smaller than a threshold voltage of a control gate can be applied to the control gate of at least one of the dummy memory layers to turn off the control gate. A set of voltages can be applied to a set of the dummy memory layers above the at least one dummy memory layer. In some embodiments, the set of voltages gradually decrease from the first channel pass voltage to the cut-off voltage. In some embodiments, the cut-off voltage is about 0 V. The at least one dummy memory layer includes the lowest of the dummy memory layers, according to some embodiments.

According to another aspect of the present disclosure, a method for operating a 3D memory device is disclosed. The 3D memory device includes a plurality of memory decks each including a plurality of memory layers in a vertical direction, and a plurality of first dummy memory layers between the first and second memory decks in the vertical direction. Each memory layer in a first memory deck of the plurality of memory decks is first programmed. The first programming includes applying a program voltage to the memory layer and a channel pass voltage smaller than the program voltage to each of the rest of the memory layers in the first memory deck. Each memory layer in a second memory deck of the plurality of memory decks above the first memory deck is second programmed. The second programming includes applying the program voltage to the memory layer and the channel pass voltage to each of the rest of the memory layers in the second memory deck. The second programming also includes applying a 0 V-voltage to at least one of the first dummy memory layers. The second programming further includes applying the 0 V-voltage to each memory layer in the first memory deck.

In some embodiments, a set of voltages are applied to a set of the first dummy memory layers above the at least one first dummy memory layer. The set of voltages can gradually decrease from the channel pass voltage to about 0 V.

In some embodiments, the at least one first dummy memory layer includes the lowest of the first dummy memory layers.

In some embodiments, the 3D memory device includes a third memory deck between the first and second memory decks and a plurality of second dummy memory layers between the first and third memory decks in the vertical direction. The 0 V-voltage can be applied to each of the memory layers in the third memory deck and the second dummy memory layers.

According to still another aspect of the present disclosure, a 3D memory device includes a peripheral circuit and a plurality of memory decks each including a plurality of memory layers in a vertical direction. The peripheral circuit is configured to program each memory layer in a first memory deck of the plurality of memory decks, and then program each memory layer in a second memory deck of the plurality of memory decks above the first memory deck. To program each memory layer in the first memory deck, the peripheral circuit is further configured to apply a program voltage to the memory layer and a first channel pass voltage smaller than the program voltage to each of the rest of the memory layers in the first memory deck. To program each memory layer in the second memory deck, the peripheral circuit is further configured to apply the program voltage to the memory layer and the first channel pass voltage to each of the rest of the memory layers in the second memory deck, and apply a second channel pass voltage smaller than the first channel pass voltage to each memory layer in the first memory deck.

In some embodiments, the 3D memory device includes a third memory deck between the first and second memory decks and a plurality of dummy memory layers between the first and third memory decks in the vertical direction. To program each memory layer in the second memory deck, the peripheral circuit can be further configured to apply the second channel pass voltage to each of the memory layers in the third memory deck and the dummy memory layers. In some embodiments, the second channel pass voltage is about 0 V.

In some embodiments, the 3D memory device includes a plurality of NAND memory strings each extending vertically through the plurality of memory decks and including a drain select transistor. The peripheral circuit can be further configured to apply a select voltage to the drain select transistor of a first NAND memory string of the NAND memory strings to select the first NAND memory string, and apply a deselect voltage to the drain select transistor of a second NAND memory string of the NAND memory strings to deselect the second NAND memory string.

In some embodiments, to program each memory layer in the second memory deck, the peripheral circuit is further configured to apply the first channel pass voltage to each of the rest of the memory layers in the second memory deck and the second channel pass voltage to each memory layer in the first memory deck, such that a partial coupling potential in the deselected second NAND memory string does not extend to the first memory deck.

In some embodiments, the 3D memory device further includes a plurality of dummy memory layers between the first and second memory decks in the vertical direction. The peripheral circuit is further configured to apply a cut-off voltage smaller than a threshold voltage of a control gate to the control gate of at least one of the dummy memory layers to turn off the control gate. In some embodiments, to program each memory layer in the second memory deck, the peripheral circuit is further configured to apply a set of voltages to a set of the dummy memory layers above the at least one dummy memory layer. The set of voltages can gradually decrease from the first channel pass voltage to the cut-off voltage. The cut-off voltage is about 0 V, according to some embodiments. In some embodiments, the at least one dummy memory layer includes the lowest of the dummy memory layers.

According to yet another aspect of the present disclosure, a 3D memory device includes a peripheral circuit, a plurality of memory decks each including a plurality of memory layers in a vertical direction, and a plurality of first dummy memory layers between the first and second memory decks in the vertical direction. The peripheral circuit is configured to program each memory layer in a first memory deck of the plurality of memory decks, and then program each memory layer in a second memory deck of the plurality of memory decks above the first memory deck. To program each memory layer in the first memory deck, the peripheral circuit is further configured to apply a program voltage to the memory layer and a channel pass voltage smaller than the program voltage to each of the rest of the memory layers in the first memory deck. To program each memory layer in the second memory deck, the peripheral circuit is further configured to apply the program voltage to the memory layer and the channel pass voltage to each of the rest of the memory layers in the second memory deck. To program each memory layer in the second memory deck, the peripheral circuit is further configured to apply a 0 V-voltage to at least one of the first dummy memory layers, and apply the 0 V-voltage to each memory layer in the first memory deck.

In some embodiments, to program each memory layer in the second memory deck, the peripheral circuit is further configured to apply a set of voltages to a set of the first dummy memory layers above the at least one first dummy memory layer. In some embodiments, the set of voltages gradually decrease from the channel pass voltage to about 0 V.

In some embodiments, the at least one first dummy memory layer includes the lowest of the first dummy memory layers.

In some embodiments, the 3D memory device includes a third memory deck between the first and second memory decks and a plurality of second dummy memory layers between the first and third memory decks in the vertical direction. To program each memory layer in the second memory deck, the peripheral circuit can be further configured to apply the 0 V-voltage to each of the memory layers in the third memory deck and the second dummy memory layers.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for operating a three-dimensional (3D) memory device, wherein the 3D memory device comprises a plurality of memory decks each comprising a plurality of memory layers in a vertical direction, and a plurality of first dummy memory layers between the first and second memory decks in the vertical direction, the method comprising:
    first programming each memory layer in a first memory deck of the plurality of memory decks, the first programming comprises applying a program voltage to the memory layer and a channel pass voltage smaller than the program voltage to each of the rest of the memory layers in the first memory deck; and
    second programming each memory layer in a second memory deck of the plurality of memory decks above the first memory deck, the second programming comprises:
        applying the program voltage to the memory layer and the channel pass voltage to each of the rest of the memory layers in the second memory deck;
        applying a 0 V-voltage to at least one of the first dummy memory layers; and
        applying the 0 V-voltage to each memory layer in the first memory deck.

2. The method of claim 1, wherein the second programming further comprises applying a set of voltages to a set of the first dummy memory layers above the at least one first dummy memory layer.

3. The method of claim 2, wherein the set of voltages gradually decrease from the channel pass voltage to about 0 V.

4. The method of claim 1, wherein the at least one first dummy memory layer comprises the lowest of the first dummy memory layers.

5. The method of claim 1, wherein the 3D memory device comprises a third memory deck between the first and second memory decks and a plurality of second dummy memory layers between the first and third memory decks in the vertical direction, the second programming further comprising applying the 0 V-voltage to each of the memory layers in the third memory deck and the second dummy memory layers.

6. A three-dimensional (3D) memory device, comprising:
    a plurality of memory decks each comprising a plurality of memory layers in a vertical direction; and
    a peripheral circuit configured to program each memory layer in a first memory deck of the plurality of memory decks, and then program each memory layer in a second memory deck of the plurality of memory decks above the first memory deck,
    wherein to program each memory layer in the first memory deck, the peripheral circuit is further configured to apply a program voltage to the memory layer and a first channel pass voltage smaller than the program voltage to each of the rest of the memory layers in the first memory deck; and
    to program each memory layer in the second memory deck, the peripheral circuit is further configured to:
        apply the program voltage to the memory layer and the first channel pass voltage to each of the rest of the memory layers in the second memory deck; and
        apply a second channel pass voltage smaller than the first channel pass voltage to each memory layer in the first memory deck.

7. The 3D memory device of claim 6, wherein
    the 3D memory device comprises a third memory deck between the first and second memory decks and a plurality of dummy memory layers between the first and third memory decks in the vertical direction; and
    to program each memory layer in the second memory deck, the peripheral circuit is further configured to apply the second channel pass voltage to each of the memory layers in the third memory deck and the dummy memory layers.

8. The 3D memory device of claim 6, wherein the second channel pass voltage is about 0 V.

9. The 3D memory device of claim 6, wherein
    the 3D memory device comprises a plurality of NAND memory strings each extending vertically through the plurality of memory decks and comprising a drain select transistor; and the peripheral circuit is further configured to:
apply a select voltage to the drain select transistor of a first NAND memory string of the NAND memory strings to select the first NAND memory string; and
apply a deselect voltage to the drain select transistor of a second NAND memory string of the NAND memory strings to deselect the second NAND memory string.

10. The 3D memory device of claim 9, wherein to program each memory layer in the second memory deck, the peripheral circuit is further configured to apply the first channel pass voltage to each of the rest of the memory layers in the second memory deck and the second channel pass voltage to each memory layer in the first memory deck, such that a partial coupling potential in the deselected second NAND memory string does not extend to the first memory deck.

11. The 3D memory device of claim 6, wherein
the 3D memory device further comprises a plurality of dummy memory layers between the first and second memory decks in the vertical direction; and
the peripheral circuit is further configured to apply a cut-off voltage smaller than a threshold voltage of a control gate to the control gate of at least one of the dummy memory layers to turn off the control gate.

12. The 3D memory device of claim 11, wherein to program each memory layer in the second memory deck, the peripheral circuit is further configured to apply a set of voltages to a set of the dummy memory layers above the at least one dummy memory layer.

13. The 3D memory device of claim 12, wherein the set of voltages gradually decrease from the first channel pass voltage to the cut-off voltage.

14. The 3D memory device of claim 11, wherein the cut-off voltage is about 0 V.

15. The 3D memory device of claim 11, wherein the at least one dummy memory layer comprises the lowest of the dummy memory layers.

16. A three-dimensional (3D) memory device, comprising:
a plurality of memory decks each comprising a plurality of memory layers in a vertical direction, and a plurality of first dummy memory layers between the first and second memory decks in the vertical direction; and
a peripheral circuit configured to program each memory layer in a first memory deck of the plurality of memory decks, and then program each memory layer in a second memory deck of the plurality of memory decks above the first memory deck,
wherein to program each memory layer in the first memory deck, the peripheral circuit is further configured to apply a program voltage to the memory layer and a channel pass voltage smaller than the program voltage to each of the rest of the memory layers in the first memory deck; and
to program each memory layer in the second memory deck, the peripheral circuit is further configured to:
apply the program voltage to the memory layer and the channel pass voltage to each of the rest of the memory layers in the second memory deck;
apply a 0 V-voltage to at least one of the first dummy memory layers; and
apply the 0 V-voltage to each memory layer in the first memory deck.

17. The 3D memory device of claim 16, wherein to program each memory layer in the second memory deck, the peripheral circuit is further configured to apply a set of voltages to a set of the first dummy memory layers above the at least one first dummy memory layer.

18. The 3D memory device of claim 17, wherein the set of voltages gradually decrease from the channel pass voltage to about 0 V.

19. The 3D memory device of claim 16, wherein the at least one first dummy memory layer comprises the lowest of the first dummy memory layers.

20. The 3D memory device of claim 16, wherein
the 3D memory device comprises a third memory deck between the first and second memory decks and a plurality of second dummy memory layers between the first and third memory decks in the vertical direction; and
to program each memory layer in the second memory deck, the peripheral circuit is further configured to apply the 0 V-voltage to each of the memory layers in the third memory deck and the second dummy memory layers.

* * * * *